US011949029B2

(12) United States Patent
Eickenscheidt et al.

(10) Patent No.: US 11,949,029 B2
(45) Date of Patent: Apr. 2, 2024

(54) TRANSPARENT MULTI-LAYER ASSEMBLY AND PRODUCTION METHOD

(71) Applicant: Albert-Ludwigs-Universitat Freiburg, Freiburg (DE)

(72) Inventors: Max Eickenscheidt, Freiburg (DE); Annette Mittnacht, Freiburg (DE); Thomas Stieglitz, Freiburg (DE); Marie T. Alt, Freiburg (DE)

(73) Assignee: Albert-Ludwigs-Universität Freiburg, Freiburg (DE)

( * ) Notice: Subject to any disclaimer, the term of this patent is extended or adjusted under 35 U.S.C. 154(b) by 372 days.

(21) Appl. No.: 17/479,287

(22) Filed: Sep. 20, 2021

(65) Prior Publication Data
US 2022/0005962 A1 Jan. 6, 2022

Related U.S. Application Data

(63) Continuation of application No. PCT/EP2020/055829, filed on Mar. 5, 2020.

(30) Foreign Application Priority Data

Mar. 19, 2019 (DE) .......................... 102019203696.1

(51) Int. Cl.
*H01L 31/0224* (2006.01)
*H01L 31/0203* (2014.01)
(Continued)

(52) U.S. Cl.
CPC .. *H01L 31/022466* (2013.01); *H01L 31/0203* (2013.01); *H01L 31/0312* (2013.01);
(Continued)

(58) Field of Classification Search
CPC ......... H01L 31/022466; H01L 31/0203; H01L 31/0312; H10K 50/8426; H10K 85/111
See application file for complete search history.

(56) References Cited

U.S. PATENT DOCUMENTS 8,492,243 B2 7/2013 Haeberlen et al.
9,029,693 B2 5/2015 Li
(Continued)

FOREIGN PATENT DOCUMENTS

CN 101933170 A 12/2010
CN 102386251 A 3/2012
(Continued)

OTHER PUBLICATIONS

N. Al-Dahoudi and M. A. Aegerter, "Comparative study of transparent conductive In2O3: Sn (ITO) coatings made using a sol and a nanoparticle suspension," "Thin Solid Films", vol. 502, No. 1-2, pp. 193-197, 2006.
(Continued)

*Primary Examiner* — David Vu
*Assistant Examiner* — Brandon C Fox
(74) *Attorney, Agent, or Firm* — Barley Snyder

(57) ABSTRACT

A transparent multi-layer assembly includes a transparent carrier structure comprising a polymer material and an electrically conductive transparent layer comprising an electrically conductive oxide. A silicon carbide layer is arranged as an adhesion promoter between the transparent carrier structure and the electrically conductive transparent layer.

20 Claims, 4 Drawing Sheets

(51) Int. Cl.
    *H01L 31/0312*    (2006.01)
    *H10K 50/842*     (2023.01)
    *H10K 85/10*      (2023.01)
    *H10K 102/00*     (2023.01)

(52) U.S. Cl.
    CPC ....... *H10K 50/8426* (2023.02); *H10K 85/111* (2023.02); *H10K 2102/351* (2023.02)

(56) References Cited

U.S. PATENT DOCUMENTS

| | | | |
|---|---|---|---|
| 11,211,573 | B2 | 12/2021 | Liu et al. |
| 2007/0184292 | A1* | 8/2007 | Lee ............... H10K 50/8445 428/522 |
| 2012/0295087 | A1 | 11/2012 | Gierens et al. |
| 2017/0018662 | A1* | 1/2017 | Feldmann ........... H01L 31/1812 |
| 2020/0411705 | A1* | 12/2020 | Lim ............... H01L 31/022483 |
| 2022/0109077 | A1* | 4/2022 | Shim .................. H01L 31/18 |

FOREIGN PATENT DOCUMENTS

| | | |
|---|---|---|
| CN | 108807671 A | 11/2018 |
| EP | 2354107 A1 | 8/2011 |
| JP | H04352369 A | 12/1992 |
| JP | 2000307141 A | 11/2000 |

OTHER PUBLICATIONS

H. Liu, V. Avrutin, N. Izyumskaya, Ü. Özgür, and H. Morkoç, "Transparent conducting oxides for electrode applications in light emitting and absorbing devices," "Superlattices and Microstructures", vol. 48, No. 5, pp. 458-484, 2010.

H.K. Lin, S. M. Chiu, T. P. Cho, and J. C. Huang, "Improved bending fatigue behavior of flexible PET/ITO film with thin metallic glass interlayer," "Mater. Lett.", vol. 113, pp. 182-185, dated Dec. 15, 2013.

Y. Jimbo et al., "Ultraflexible Transparent Oxide/Metal/Oxide Stack Electrode with Low Sheet Resistance for Electrophysiological Measurements," (engl), "ACS applied materials & interfaces", vol. 9, No. 40, pp. 34744-34750, 2017.

PCT International Search Report and The Written Opinion, and English translation of the Search Report, International Application No. PCT/EP2020/055829, dated Jun. 29, 2020, 14 pages.

Chinese Office Action dated Jul. 25, 2023 with English translation, corresponding to Application No. 202080021902.7 12 pages.

T. Minami, "Present status of transparent conducting oxide thin-film development for Indium-Tin-Oxide (ITO) substitutes," "Thin Solid Films", vol. 516, No. 17, pp. 5822-5828, 2008.

S. K. Park, et al. "Mechanical Stability of Externally Deformed Indium-Tin-Oxide Films on Polymer Substrates," Japanese Journal of Applied Physics, vol. 42, No. part 1, No. 2A, pp. 623-629, Feb. 2003.

K. A. Sierros, et al. "Stress-corrosion cracking of indium tin oxide coated polyethylene terephthalate for flexible optoelectronic devices," "Thin Solid Films", vol. 517, No. 8, pp. 2590-2595, 2009.

B. Sim, et al. "Highly enhanced mechanical stability of indium tin oxide film with a thin A1 buffer layer deposited onto plastic substrate," Surface & Coating Technology, vol. 204, No. 3, pp. 309-312, 2009.

D.-P. Tran, et al., "Effects of cyclic deformation on conductive characteristics of indium tin oxide thin film on polyethylene terephthalate substrate," Surface & Coatings Technology, vol. 283, pp. 298-310, 2015.

* cited by examiner

TRANSPARENT MULTI-LAYER ASSEMBLY AND PRODUCTION METHOD

CROSS-REFERENCE TO RELATED APPLICATIONS

This application is a continuation of PCT International Application No. PCT/EP2020/055829, filed on Mar. 5, 2020, which claims priority under 35 U.S.C. § 119 to German Patent Application No. 102019203696.1, filed on Mar. 19, 2019.

FIELD OF THE INVENTION

The present invention relates to a transparent multi-layer assembly, such as is used, for example, to produce solar cells or organic light-emitting diodes (OLEDs), and to a corresponding production method.

BACKGROUND

Transparent electrodes are, for example, an essential element of flexible optoelectronic applications such as displays, imaging units, and sensors. Highly conductive electrodes are there preferred in order to keep the electrical resistance low. In particular so-called wearables, i.e. electronic devices that can be worn on the body, or implantable arrangements place high demands on the flexibility, reliability, and long-term stability.

Transmissible metallic and semiconducting thin layers (so-called TCOs, transparent conductive oxides) are of particular importance in the solar industry and display screen development. Such TCOs are described, for example, in the publications N. Al-Dahoudi and M. A. Aegerter, "Comparative study of transparent conductive $In_2O_3$: Sn (ITO) coatings made using a sol and a nanoparticle suspension," "Thin Solid Films", vol. 502, no. 1-2, pages 193-197, 2006, and H. Liu, V. Avrutin, N. Izyumskaya, Ü. Özgür, and H. Morkoç, "Transparent conducting oxides for electrode applications in light emitting and absorbing devices," "Superlattices and Microstructures", vol. 48, no. 5, pages 458-484, 2010.

One material that is frequently used for newer developments is the semiconductor ITO (indium tin oxide), the electrical properties of which can be selectively adjusted by doping (see e.g. B. T. Minami, "Present status of transparent conducting oxide thin-film development for Indium-Tin-Oxide (ITO) substitutes," "Thin Solid Films", vol. 516, no. 17, pages 5822-5828, 2008).

However, ITO has problematic mechanical properties, in particular since it tends to develop cracks due to its brittle fracture behavior. In order to nevertheless integrate ITO into the various production processes and thereby maintain its integrity, ITO is usually deposited onto firm materials (e.g. glass or metal), as described in the following articles: H. K. Lin, S. M. Chiu, T. P. Cho, and J. C. Huang, "Improved bending fatigue behavior of flexible PET/ITO film with thin metallic glass interlayer," "Mater. Lett.", vol. 113, pages 182-185, 2013; S. K. Park, J. I. Han, D. G. Moon, and W. K. Kim, "Mechanical Stability of Externally Deformed Indium-Tin-Oxide Films on Polymer Substrates," "Jpn. J. Appl. Phys.", vol. 42, no. part 1, no. 2A, pages 623-629, 2003; K. A. Sierros, N. J. Morris, K. Ramji, and D. R. Cairns, "Stress-corrosion cracking of indium tin oxide coated polyethylene terephthalate for flexible optoelectronic devices," "Thin Solid Films", vol. 517, no. 8, pages 2590-2595, 2009; B. Sim, E.-H. Kim, J. Park, and M. Lee, "Highly enhanced mechanical stability of indium tin oxide film with a thin Al buffer layer deposited onto plastic substrate," "Surf. Coat. Technol.", vol. 204, no. 3, pages 309-312, 2009; D.-P. Tran, H.-I. Lu, and C.-K. Lin, "Effects of cyclic deformation on conductive characteristics of indium tin oxide thin film on polyethylene terephthalate substrate," "Surf. Coat. Technol.", vol. 283, pages 298-310, 2015. New developments in the electronics industry tend towards flexible base materials made of polymers in order to be able to map changeable and more complex structures with the conductive film. Inter alia the following problems arise with known structures.

Known ITO layers have to be deposited and structured on firm carrier material during the production process. Subsequent steps must not introduce any thermal or mechanical stresses into the film, since such stresses generate cracks and defects in the brittle film. Thermal treatment (between 200° C. and 800° C.) of the TCO film, however, is essential, e.g. for very good electrical conductivity (see N. Al-Dahoudi and M A Aegerter, "Comparative study of transparent conductive $In_2O_3$: Sn (ITO) coatings made using a sol and a nanoparticle suspension," "Thin Solid Films", vol. 502, no. 1-2, pages 193-197, 2006).

A transmissible and flexible coating and/or encapsulation of the ITO layers is therefore only possible to a limited extent and no longevity is then guaranteed. Current approaches are inadequate, in particular in fields of application with alternating mechanical loads or high levels of moisture, since protective layers are only possible that are deposited and cure at room temperature (e.g. parylene as described in Y. Jimbo et al., "Ultraflexible Transparent Oxide/Metal/Oxide Stack Electrode with Low Sheet Resistance for Electrophysiological Measurements," (engl), "ACS applied materials & interfaces", vol. 9, no. 40, pages 34744-34750, 2017, silicone or the like). These layers then pose very specific demands on the cleaning and subsequent development processes.

In summary, currently available multi-layer assemblies with transmissible conductive or semiconductive thin layers have the disadvantage that no subsequent coating or processing of the layers requiring annealing at elevated temperatures can be carried out. Therefore, the TCO is always one of the last process steps or needs to be coated with polymers that are deposited at low temperatures close to room temperature. Parylene is currently the only flexible polymer material that can be deposited in a CVD process (chemical vapor deposition) at room temperature; other CVD deposits do not result in flexible layers.

TCO and ITO layers need to be deposited directly on glass or another firm carrier, which does not allow for any mechanical flexibility.

In order to create sufficient adhesion between TCO and a flexible carrier polymer, it is also known to interpose a thin metal layer, e.g. aluminum, silver, titanium, or platinum, as an adhesion promoter. However, this solution has the drawback that, firstly, the electrical properties are greatly influenced. Furthermore, the entire multi-layer structure is no longer sufficiently optically transparent if a metal layer is arranged under the TCO.

There is therefore a need for optically transparent multi-layer assemblies which overcome the drawbacks of known solutions and are safe and reliable, but can still be produced inexpensively.

SUMMARY

A transparent multi-layer assembly includes a transparent carrier structure comprising a polymer material and an electrically conductive transparent layer comprising an electrically conductive oxide. A silicon carbide layer is arranged as an adhesion promoter between the transparent carrier structure and the electrically conductive transparent layer.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
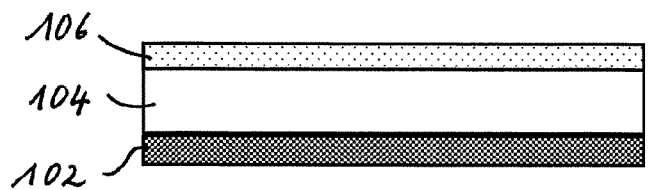
FIG. 1 is a sectional side view of a starting material of a production method of a transparent multi-layer assembly according to a first embodiment.

For a better understanding of the present invention, it shall be explained in more detail with reference to the embodiments shown in the figures. Herein, the same parts are provided with the same reference numerals and the same component names. Furthermore, some features or combinations of features from the different embodiments shown and described can represent inventive solutions independent in themselves according to the invention.

The following terms and definitions are used hereafter.

In the context of the present invention, the term "flexible" means that a layer or a substrate can be bent and, in particular, can be deformed within certain limits without fracturing.

The term "electrically conductive" is understood hereafter to mean that a material is able to conduct electrical current and is suitable for the formation of electrodes. In addition to conductivity, which, for example, is exhibited by metals, the conductivity of semiconducting material is also intended to be included in the context of the present invention.

In the context of the present invention, the terms "transparent" and "transmissible" are intended to denote the high transmissibility for specific light wavelengths, in particular in the visible range. However, it is clear to a person skilled in the art that the principles of the present invention can also be applied in the context of transmissibility for radiation in the infrared range.

The transparent multi-layer structure according to the present invention shall be explained according to a first embodiment and its production in more detail hereafter with reference to the figures, and in particular first with reference to FIGS. 1 to 6. It is noted that the size ratios in all of the figures and in particular the layer thickness ratios are not shown true to scale.

Figure 2:
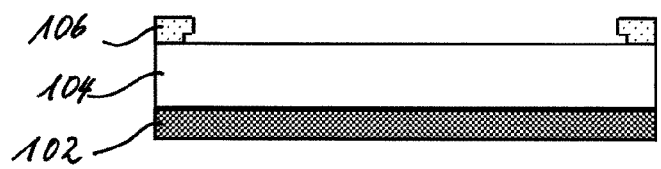
FIG. 2 is a sectional side view of a next step of the production method of the transparent multi-layer assembly according to the first embodiment.

FIG. 1 shows schematically as the starting material a silicon wafer 102 which is coated with a transparent carrier layer, for example, a polyimide layer 104 and a photoresist 106. Silicon wafer 102 serves as a substrate only during the microsystem production of multi-layer assembly 100 according to the invention and is subsequently removed. In a photolithographic exposure and structuring step, as is generally known, the photoresist 106 is structured in such a way that polyimide (PI) 104 is exposed in the regions in which the later TCO structure (for example ITO) is to be formed (FIG. 2).

Figure 3:
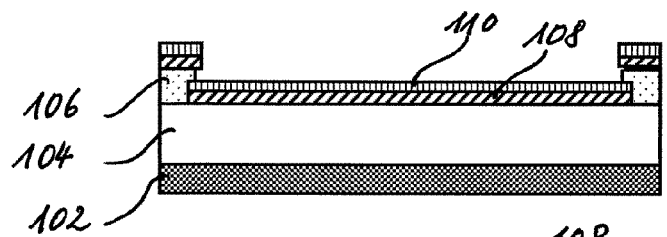
FIG. 3 is a sectional side view of a next step of the production method of the transparent multi-layer assembly according to the first embodiment.

In the next step, shown in FIG. 3, a continuous layer of silicon carbide 108 is first applied according to the present invention. Silicon carbide layer 108 is applied, in an embodiment, by way of PECVD deposition. Silicon carbide layer 108 can have a thickness of between 10 nm and 100 nm, for example, 50 nm. In this thickness range, but also significantly thicker, silicon carbide is transmissible for most of the wavelengths of interest.

PECVD (plasma enhanced chemical vapor deposition) describes a process in which thin films of different materials can be deposited onto substrates at a lower temperature than with standard CVD (chemical vapor deposition) processes. In PECVD processes, the deposition is effected by supplying reactive gases between parallel electrodes, a grounded electrode, and an RF electrode. The capacitive coupling between the electrodes excites the reactive gases to form a plasma, which in turn leads to the desired chemical reaction. This causes the reaction product, in the present case SiC, to be deposited onto the substrate. The substrate arranged on the grounded electrode is typically heated to temperatures between 250° C. to 350° C. In comparison, conventional CVD processes typically require 600° C. to 800° C. The inventors of the present invention were even able to reach temperatures between 100° C. and 120° C. with the deposition of the SiC, so that the photoresist is not damaged and consequently a lift-off process and photo structuring are made possible.

Due to its specific chemical and physical properties, silicon carbide 108 forms a particularly close bond with the underlying polymer layer, for example, polyimide 104.

A transparent electrically semiconducting TCO layer 110 is subsequently applied onto silicon carbide layer 108. This state is illustrated in FIG. 3. According to the present invention, the electrically conductive oxide of the layer 110 can comprise, for example, indium tin oxide, ITO, fluorine tin oxide, FTO, aluminum zinc oxide, AZO, and/or antimony tin oxide, ATO.

For example, such an ITO layer 110 can be deposited with the aid of reactive cathode sputtering. Reactive cathode sputtering describes a deposition process in which atoms are removed from a solid (target) by bombarding them with high-energy ions (predominantly noble gas ions) and transition into the gas phase, wherein one or more reactive gases (e.g. oxygen or nitrogen) are added to an inert working gas (e.g. argon). The gases react on the target, in the vacuum chamber, or on the substrate with the atomized layered atoms and form new materials. The resulting reaction products, in the present case ITO, then deposit onto the substrate surface.

Due to the silicon content in silicon carbide 108, the silicon carbide layer is also able to form a firm bond with ITO layer 110. Silicon carbide layer 108 therefore forms a thin layer acting as an adhesion promoter between transparent polymer material (polyimide) 104 and the electrically conductive material TCO, for example, ITO, 110. The silicon carbide adhesion promoter 108 has only very small influence on the electrical and semiconducting properties of a TCO film 110, but has optimal bonding properties, firstly, to the carbon chemistry of the polymer and, secondly, to the oxide structure of the TCO film 110. The silicon carbide 108 therefore exhibits excellent adhesion to polymers based on the carbon content and, on the other hand, forms very good adhesion to the TCO semiconductor due to the silicon content.

Figure 4:
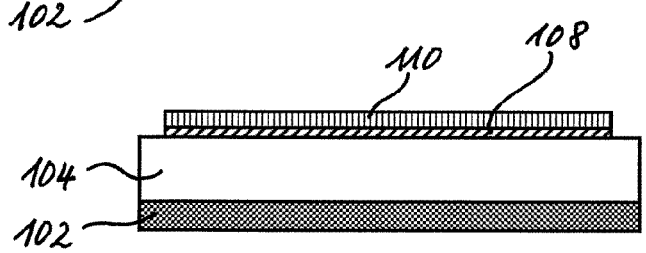
FIG. 4 is a sectional side view of a next step of the production method of the transparent multi-layer assembly according to the first embodiment.

Due to the lift-off of photoresist 106, adhesion promoter 108 as well as TCO 110 are removed in the subsequent step at all those places where it is not desired. As shown in FIG. 4, only structured TCO layers 110 bonded to substrate 104 by adhesion promoter 108 remain.

Figure 5:
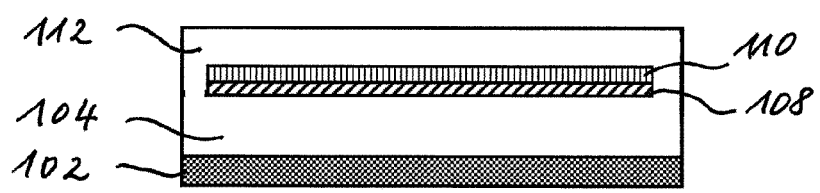
FIG. 5 is a sectional side view of a next step of the production method of the transparent multi-layer assembly according to the first embodiment.

As shown in FIG. 5, a further polyimide layer 112 can optionally be deposited as a top layer 112 onto structured TCO layer 110. Any other transparent polymer layer is of course also suitable as a top layer 112. In the example shown, carrier layer 104 and top layer 112 consist of the same material. However, this need not be the case; different materials can of course also be used. For example, the following materials can be considered for top layer 112 as well as for carrier layer 104: polyimide, PI, polyethylene terephthalate, PET, polyethylene, PE, polycarbonate, PC, polyvinyl chloride, PVC, polyamide, PA, polytetrafluoroethylene, PTFE, polymethyl methacrylate, PMMA, polyether ether ketone, PEEK, polysulfone, PSU, poly (p-xylylene), polydimethylsiloxane, PDMS, and/or polypropylene, PP. Specifically, polyimide is particularly inert and chemically stable.

Top layer 112 is used for electrical insulation, but also for protection against chemical and mechanical environmental influences. Top layer 112 can be a polyimide layer which is spin-coated in the form of a liquid precursor and then thermally treated for being cured. As is known, this requires comparatively high temperatures, for example, 450° for 10 minutes. It is possible to show that the adhesion of TCO film 110 to carrier layer 104 is not impaired by this stress. The provision of the silicon carbide adhesion promoter 108 according to the invention therefore allows transparent electrically conductive layers to be subjected to further process steps, also entailing higher temperatures, after they have been applied to their carrier 104. In particular, transparent electrically conductive layers can be embedded in polymers, so that a transparent flexible structure can be obtained that is protected from the outside and electrically insulated.

A second silicon carbide layer can optionally be arranged as an adhesion promoter between the top layer 112 and the electrically conductive transparent layer 110 in order to improve the adhesion of the top layer 112 to the electrically conductive transparent layer 110.

In order to be able to electrically contact TCO layer 110 from the outside, contact regions and/or active structures are exposed through openings 114 in top layer 112, for example, with the aid of a dry etching step. Furthermore, transparent flexible carrier layer 104 is separated from silicon substrate 102. This can also be done in an etching step. Finally, the separation of individual components can be provided, which are processed together as a batch as long as they are arranged on silicon wafer 102.

In an embodiment, the electrically conductive transparent layer 110 is structured in order to form at least one electrode. The at least one electrode can there comprise a single electrode as well as an array composed of a plurality of electrodes. Finely structured electrodes also adhere reliably to the carrier structure 104.

Figure 6:
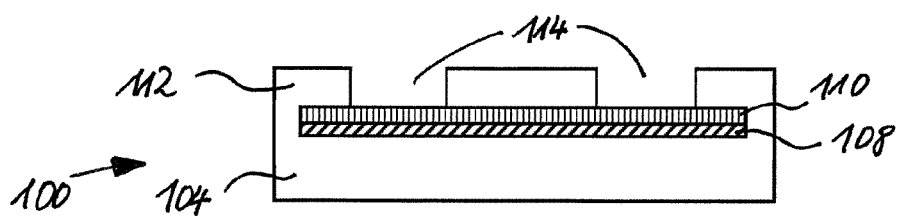
FIG. 6 is a sectional side view of a completed transparent multi-layer assembly according to the first embodiment.
Figure 7:
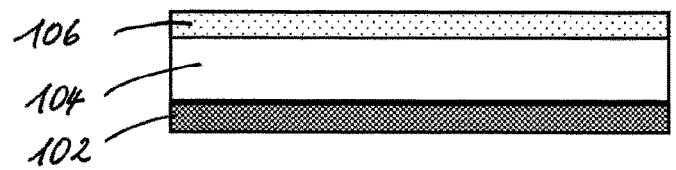
FIG. 7 is a sectional side view of a starting material of a production method of a transparent multi-layer assembly according to a further embodiment.
Figure 8:
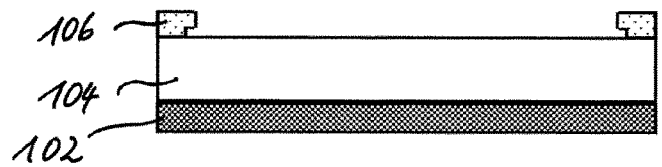
FIG. 8 is a sectional side view of a next step of the production method of the transparent multi-layer assembly according to the further embodiment.
Figure 9:
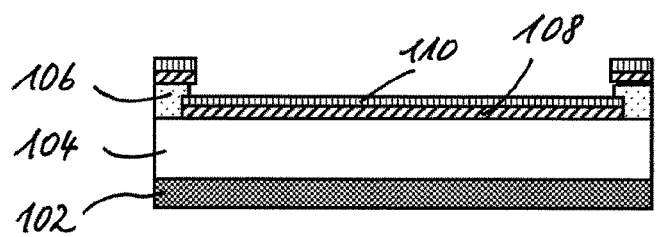
FIG. 9 is a sectional side view of a next step of the production method of the transparent multi-layer assembly according to the further embodiment.
Figure 10:
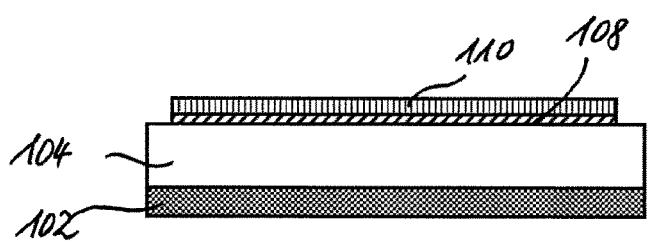
FIG. 10 is a sectional side view of a next step of the production method of the transparent multi-layer assembly according to the further embodiment.

FIG. 6 shows completed transparent multi-layer structure 100 with openings 114 shown schematically.

The production of a transparent multi-layer assembly according to a further embodiment shall be described below with reference to FIGS. 7 to 13. The manufacturing steps shown in FIGS. 7 to 10 correspond to those from FIGS. 1 to 4 and the description shall therefore not be repeated.

Figure 11:
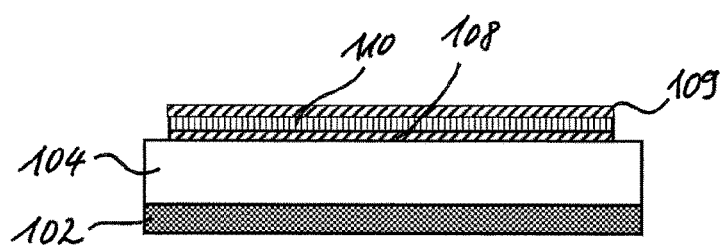
FIG. 11 is a sectional side view of a next step of the production method of the transparent multi-layer assembly according to the further embodiment.

As shown schematically in FIG. 11, a further adhesive layer 109 is provided according to a further embodiment between top layer 112 and underlying TCO layer 110. Adhesion promoter layer 109 can on the one hand be formed by a further silicon carbide layer corresponding to silicon carbide layer 108. However, it could be shown in experimental investigations that the adhesion promotion between a top layer polymer deposited onto the TCO film is not identical to the adhesion promotion between a TCO film deposited onto the polymer substrate. In particular, even further improved adhesion of top layer 112 to the TCO can be obtained by applying a diamond-like carbon (DLC) layer in addition to a further silicon carbide layer before the polymer top layer is deposited. The DLC layer is applied, for example, in a low-temperature process such as PECVD deposition at a maximum of 100° C. Such an additional DLC layer, in an embodiment, has a thickness of approx. 10 nm. Optimum adhesion of the polymer top layer can be achieved in this manner. Instead of directly covering TCO layer 110 with top layer 112 shown in FIG. 5, the double layer SiC-DLC is further provided as an adhesion promoter layer 109 between TCO layer 110 and top layer 112.

Figure 12:
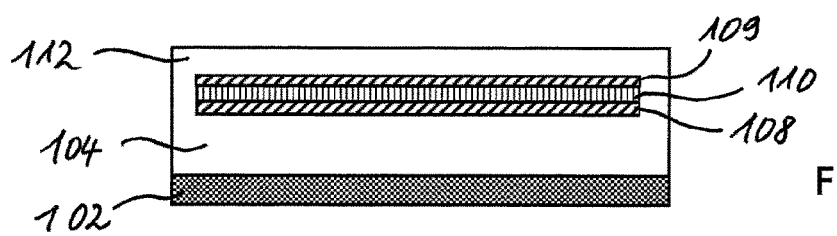
FIG. 12 is a sectional side view of a next step of the production method of the transparent multi-layer assembly according to the further embodiment.

As shown in FIG. 12, a further polyimide layer can optionally be deposited similarly to FIG. 5 as a top layer 112 onto structured TCO layer 110. Top layer 112 is used for electrical insulation, but also for protection against chemical and mechanical environmental influences.

Figure 13:
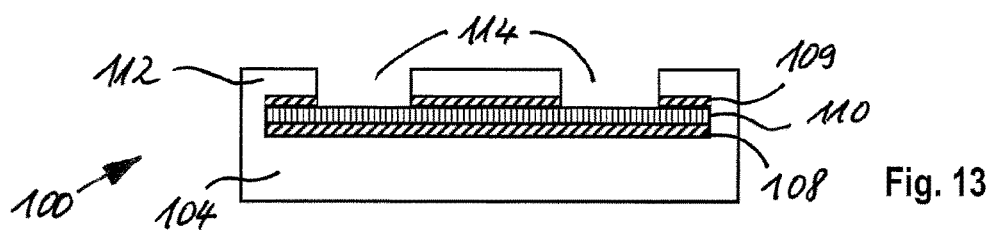
FIG. 13 is a sectional side view of a completed transparent multi-layer assembly according to the further embodiment.

In order to be able to electrically contact TCO layer 110 from the outside, contact regions and/or active structures are exposed through openings 114 in top layer 112, for example, with the aid of a dry etching step. Adhesion promoter layer 109 is also opened in the process, as shown in FIG. 13. Furthermore, transparent flexible carrier layer 104 is separated from silicon substrate 102. This can also be done in an etching step. Finally, the separation of individual components can again be provided, which are processed together as a batch as long as they are arranged on silicon wafer 102.

FIG. 13 shows completed transparent multi-layer structure 100 with openings 114 shown schematically.

Figure 14:
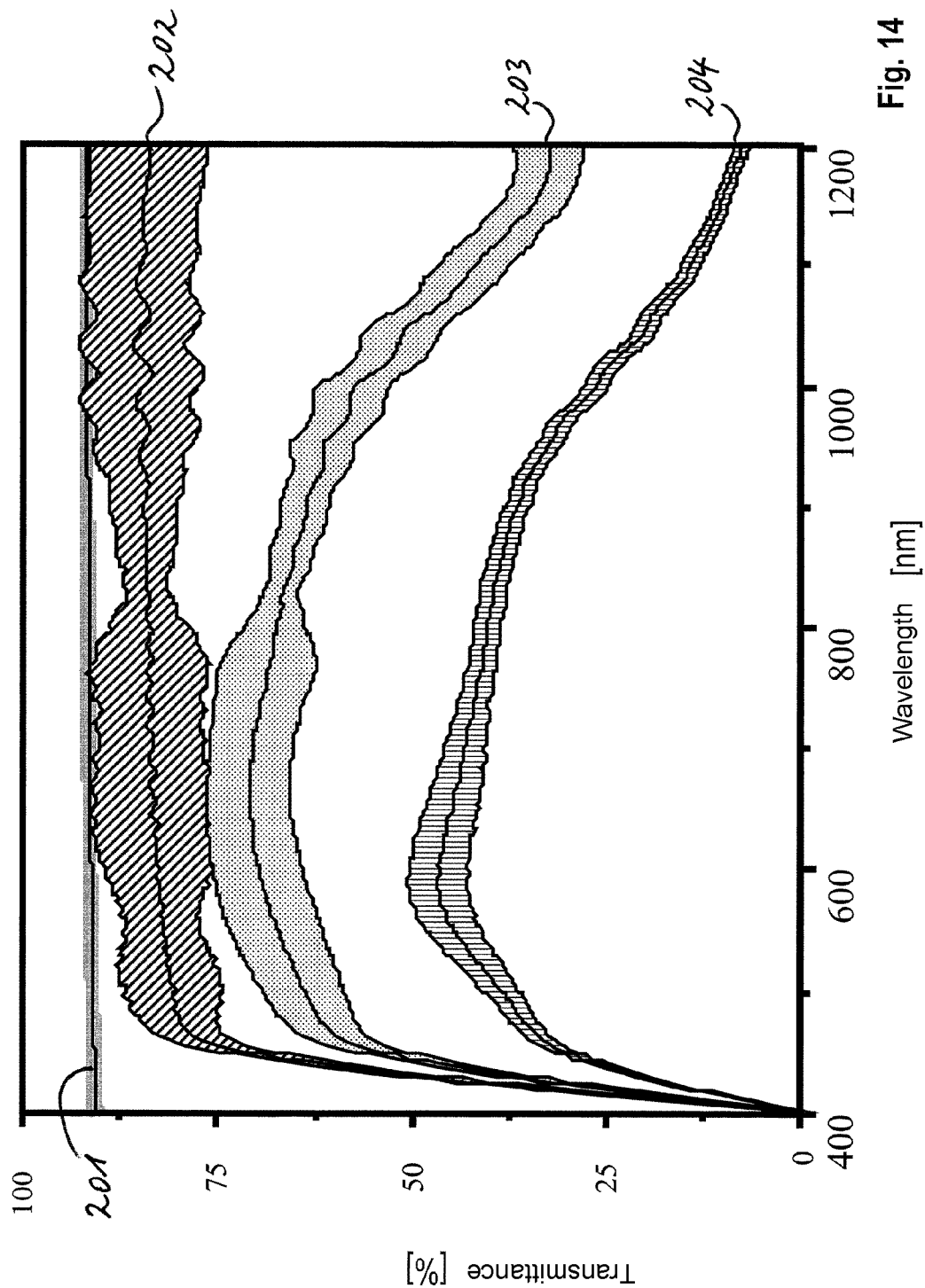
FIG. 14 is a graph of wavelength-dependent transmittance of various layers of the transparent multi-layer structure.

FIG. 14 shows the transmittance (in %) for the various materials provided in transparent multi-layer structure 100 as a function of the wavelength (in nm) compared to a glass layer which is required as a substrate for measuring the transmittance. Each curve shows the mean value of the measurement results and the associated standard deviation. Curve 201 denotes the transmissibility of glass, curve 202 the transmissibility of a PI layer having a thickness of 5 µm on a glass substrate, curve 203 the transmissibility of an ITO layer having a thickness of 300 nm on 5 µm PI and the glass substrate, and curve 204 the transmissibility of an ITO layer having a thickness of 600 nm on 5 µm PI and the glass substrate. A SiC adhesion promoter layer each is arranged between the PI carrier and the ITO layer.

As shown in FIG. 14, the transmittance of glass (curve 201) for visible to near-infrared light has an almost constant value of 91%, while about 80% of the visible light penetrates through the PI layer above 470 nm (curve 202). The multi-layer structure with an ITO layer shows a maximum transmittance in the range of 600 nm, wherein the transmittance is significantly dependent on the layer thickness of the ITO layer (curves 203 and 204).

Application examples for the transparent multi-layer structure according to the invention are shown and described below with reference to FIGS. 15 to 17 in which the production method proceeds from bottom to top in a manner similar to the steps from FIGS. 1 to 6.

Figure 15:
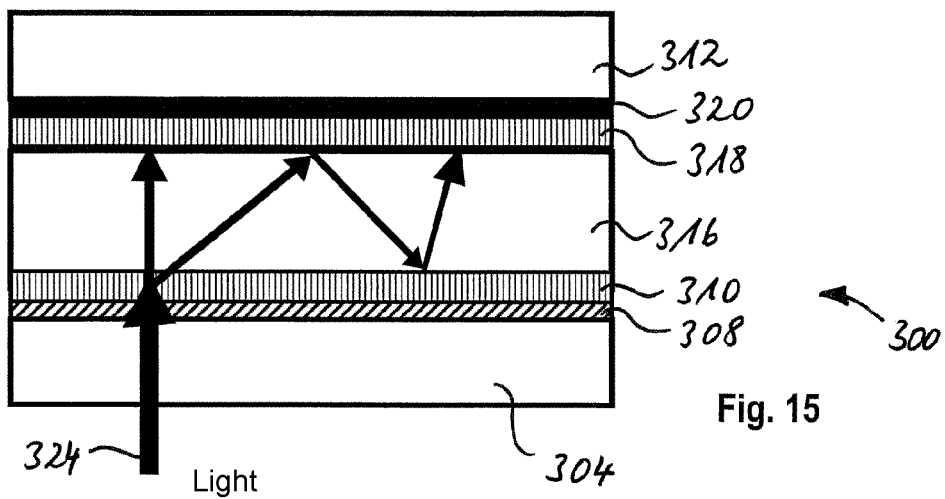
FIG. 15 is a sectional side view of a solar cell according to a first embodiment.

FIG. 15 shows a first technical application example for the transparent multi-layer structure according to the invention. In this schematic sectional representation, a so-called micro-morph solar cell 300 with hydrogenated amorphous and microcrystalline silicon (a-Si: H/µc-Si: H) is shown as active layer 316. As is known and is described, for example, in the article H. Liu, V. Avrutin, N. Izyumskaya, Ü. Özgür, and H. Morkoç, "Transparent conducting oxides for electrode applications in light emitting and absorbing devices," "Superlattices and Microstructures", vol. 48, no. 5, pages 458-484, 2010, solar cells use a photovoltaic effect to convert incident light into electrical current. Electron-hole pairs are generated by light quanta and separated at an interface between two materials having different conduction polarity. Various types of solar cells are of interest in the context of conductive oxides. In principle, a distinction can be made inter alia between thick-film and thin-film silicon solar cells, thin-film cells with single or multiple barrier layers, dye-sensitized solar cells, organic/polymer cells, and highly efficient solar cells with multiple barrier layers based on III-V semiconductors.

TCOs are used as transparent electrodes in many types of thin film solar cells, such as silicon thin film solar cells, CdTe thin film solar cells, and copper indium gallium diselenide (CIGS) thin film solar cells. The charge carrier concentration in the TCO must be as low as possible in order to prevent undesired free charge carrier absorption in the infrared range, while the charge carrier mobility should be as high as possible in order to create sufficiently high conductivity.

The advantage of thin film silicon cells is inter alia that they are less expensive. Various different photovoltaic technologies are based on silicon thin films, for example, on hydrogenated amorphous silicon (a-Si: H) with a quasi-direct band gap of 1.8 eV, hydrogenated microcrystalline silicon (µc-Si: H) with an indirect band gap of 1.1 eV, a combination of these two forms (micromorphous silicon) and polycrystalline silicon on glass (PSG).

The first three technologies mentioned use TCOs as front side and/or rear side electrodes. According to the invention, silicon carbide is used as an adhesion promoter between the TCO layer and the respective carrier material. For example, such a cell can be structured according to the "superstate" principle in which the light penetrates through the carrier material into the active inner zone. For such a solar cell, the production method begins on the front side of the cell facing the light during operation and proceeds toward the rear side. First, a TCO front side contact layer is deposited onto a transparent substrate layer, followed by the deposition of amorphous and/or microcrystalline silicon and a TCO or metallic rear side contact layer. The TCO front side contact layer must therefore be sufficiently robust to withstand all subsequent layer depositions and treatment steps undamaged. In known assemblies, the substrate layer is typically made of glass. According to the present invention, however, a polymer layer is used so that the solar cell is also flexible.

A glass substrate ("superstrate") is used in known solar cells on the side of the incidence of light, which does not allow for any mechanical flexibility. In contrast, solar cell 300 according to the invention has a flexible transparent polymer carrier material 304 as a superstrate on the side of the incidence of light. A TCO front electrode layer 310 is bonded the polymer carrier material 304 by way of a SiC adhesion promoter layer 308. SiC 308 therefore allows for a flexible and transparent front side that prevents corrosion of TCO layer 310.

An a-Si: H/µc-Si: H layer is provided as active layer 316 (which is also referred to as the absorber layer), as shown in FIG. 15. This photovoltaically active layer 316 is followed by a further TCO layer 318 which serves as a rear-side contact. A metal layer 320 is used for mirroring, as a diffusion barrier, and for increased electrical conductivity. A further polymer layer 312 serves as an encapsulating top layer.

Light 324 that is incident through transparent carrier layer 304 is reflected and scattered several times due to the different refractive indices of silicon and TCO layers 310, 316, 318, respectively, and in this way "trapped" in silicon absorber layer 316, as shown in FIG. 15. The thickness of absorber layer 316 can be kept comparatively small in this manner, which saves costs and increases the stability of solar cell 300.

Entire solar cell 300 can be flexible, so that it can e.g. be rolled up when not in use or can adapt to different ground profiles.

Figure 16:
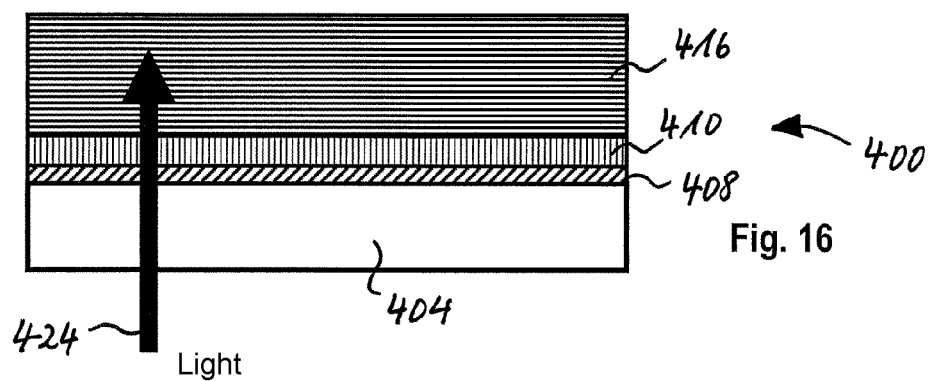
FIG. 16 is a sectional side view of a solar cell according to a second embodiment.

As a further technical application example of the transparent multi-layer structure according to the invention, a solar cell 400 with a CdTe (cadmium telluride) or CIGS (copper-indium-gallium-diselenide) absorber layer 416 is shown in FIG. 16. In general, all current thin-film solar cells with the associated layers can be transferred to flexible substrates according to the invention. Even organic solar cells with photosensitive layers can be stabilized in this way.

According to the invention, solar cell 400 has a flexible transparent polymer carrier material 404 on side 424 of the incidence of light. A TCO front electrode layer 410 is bonded to polymer carrier material 404 by way of a SiC adhesion promoter layer 408. SiC adhesion promoter 408 therefore allows for a flexible and transparent front side that prevents corrosion of TCO layer 410. Active layer 416 is formed by a CdTe or CIGS absorber layer. As is known and explained e.g. in the article H. Liu, V. Avrutin, N. Izyumskaya, Ü. Özgür, and H. Morkoç, "Transparent conducting oxides for electrode applications in light emitting and absorbing devices," "Superlattices and Microstructures", vol. 48, no. 5, pages 458-484, 2010, absorber layer 416 in the case of CdTe solar cells is typically a multi-layer structure comprising CdTe and CdS layers as well as a rear side metallization.

In the case of CIGS solar cells, the absorber layer 416 in addition to the actual CIGS absorber material also contains a CdS layer and a rear side metallization. However, it is clear to a person skilled in the art that the principles according to the invention are compatible with any further layer sequence required, which may additionally be applied to absorber layer 416.

In general, all current thin-film solar cells with the associated layers can be transferred to flexible substrates according to the invention. Even organic solar cells with photosensitive layers can be stabilized in this way.

Figure 17:
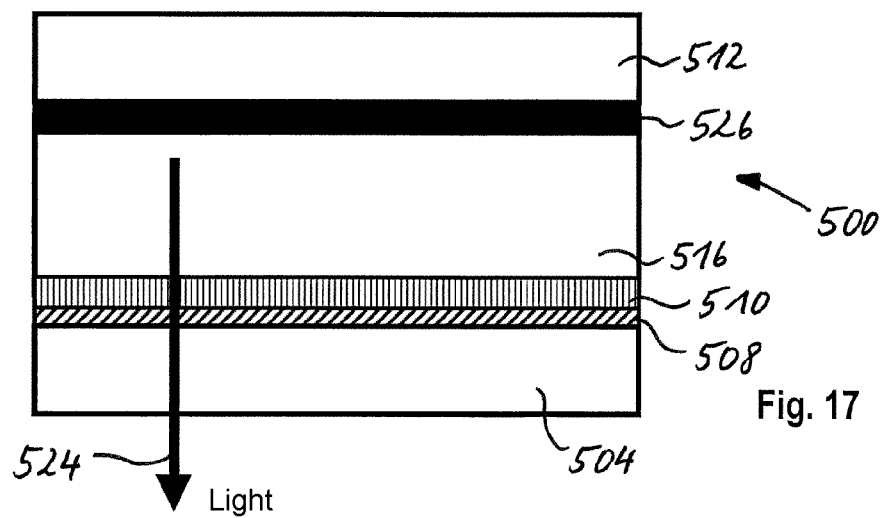
FIG. 17 is a sectional side view of an OLED according to an embodiment.

An organic light-emitting diode (OLED) 500 is shown in FIG. 17 as a further technical application example of a transparent multi-layer assembly according to the present invention.

OLED 500 has an active organic layer 516, also referred to as an emitter layer 516, between two electrodes, a metal cathode 526, and a transparent TCO anode 510. The typical thickness of the organic films is around 100 to 200 nm. Two types of organic materials are typically used: long-chain polymers or small molecules. When a voltage is applied between the anode and the cathode, cathode 526 injects electrons into film 516. At the same time, holes (positive charges) are injected into organic material 516 from transparent anode 510 with a high electron affinity. In the electric field, positive and negative charges migrate through organic film 516. When they recombine, they form excited states. When they decay, photons are emitted and light 524 is emitted.

According to the invention, TCO layer 510 is bonded to a transparent polymer layer 504 by way of a silicon carbide layer 508. A polymer top layer 512 completes the layer sequence of OLED 500. The component can be completely encapsulated in this way in order to be protected against external influences. In addition, OLED 500 is completely flexible because a glass carrier can be dispensed with.

The present invention provides silicon carbide as a transparent adhesion promoter between polymers and TCOs, in particular for flexible thin-film applications in the field of liquid crystal display screens, organic light-emitting diodes, touchscreens, switchable glazing, thin-film solar cells, photovoltaics, display technology, lighting technology, automotive technology, architectural glazing, electrophysiological electrodes, pH sensors, and antibody detectors.

This enables successful non-hermetic encapsulation of TCO layers, in particular for long-term stable use in aqueous media (or humid environments). This provides thermally and mechanically stable transmissible layers for the above-mentioned applications.

What is claimed is:

1. A transparent multi-layer assembly, comprising:
   a transparent carrier structure comprising a polymer material;
   an electrically conductive transparent layer comprising an electrically conductive oxide; and
   a silicon carbide layer arranged as an adhesion promoter between the transparent carrier structure and the electrically conductive transparent layer.

2. The transparent multi-layer assembly of claim 1, wherein the polymer material of the transparent carrier structure is at least one of polyimide, PI, polyethylene terephthalate, PET, polyethylene, PE, polycarbonate, PC, polyvinyl chloride, PVC, polyamide, PA, polytetrafluoroethylene, PTFE, polymethyl methacrylate, PMMA, polyether ether ketone, PEEK, polysulfone, PSU, poly(p-xylylene), polydimethylsiloxane, PDMS, and polypropylene, PP.

3. The transparent multi-layer assembly of claim 1, wherein the electrically conductive oxide is at least one of indium tin oxide, ITO, fluorine tin oxide, FTO, aluminum zinc oxide, AZO, and/or antimony tin oxide, ATO.

4. The transparent multi-layer assembly of claim 1, wherein the silicon carbide layer has a thickness between 10 nm and 100 nm.

5. The transparent multi-layer assembly of claim 4, wherein the silicon carbide layer has a thickness of approximately 50 nm.

6. The transparent multi-layer assembly of claim 1, wherein the electrically conductive transparent layer is structured to form an electrode.

7. The transparent multi-layer assembly of claim 1, further comprising a transparent top layer covering the electrically conductive transparent layer at least in part.

8. The transparent multi-layer assembly of claim 7, wherein the transparent top layer comprises a polymer material.

9. The transparent multi-layer assembly of claim 8, further comprising a second silicon carbide layer arranged between the transparent top layer and the electrically conductive transparent layer as an adhesion promoter.

10. The transparent multi-layer assembly of claim 8, further comprising a double layer made of a silicon carbide layer and a diamond-like carbon layer arranged between the transparent top layer and the electrically conductive transparent layer as an adhesion promoter.

11. A method for producing a transparent multi-layer assembly, comprising:
    providing a transparent carrier structure comprising a polymer material;
    applying a silicon carbide layer onto the transparent carrier structure; and
    applying an electrically conductive transparent layer comprising an electrically conductive oxide onto the silicon carbide layer, the silicon carbide layer forming an adhesion promoter between the transparent carrier structure and the electrically conductive transparent layer.

12. The method of claim 11, wherein the electrically conductive transparent layer is structured by a photolithography process.

13. The method of claim 11, wherein the silicon carbide layer is deposited onto the transparent carrier structure in a PECVD process.

14. The method of claim 11, wherein the electrically conductive transparent layer is deposited onto the silicon carbide layer by reactive cathode sputtering.

15. The method of claim 11, further comprising applying a transparent top layer comprising polymer material to cover the electrically conductive transparent layer at least in part.

16. The method of claim 15, further comprising depositing a second silicon carbide and diamond-like carbon layer as an adhesion promoter between the transparent top layer and the electrically conductive transparent layer.

17. The method of claim 15, further comprising introducing a plurality of contact openings in an etching step into the transparent top layer.

18. The method of claim 17, wherein the electrically conductive transparent layer can be contacted through the contact openings.

19. A solar cell, comprising:
an absorber layer; and
a transparent multi-layer assembly including a transparent carrier structure comprising a polymer material, an electrically conductive transparent layer comprising an electrically conductive oxide, and a silicon carbide layer arranged as an adhesion promoter between the transparent carrier structure and the electrically conductive transparent layer, the electrically conductive transparent layer is electrically and optically bonded to the absorber layer.

20. An organic light-emitting diode, comprising:
a cathode;
an emitter layer;
an anode; and
a transparent multi-layer assembly including a transparent carrier structure comprising a polymer material, an electrically conductive transparent layer comprising an electrically conductive oxide, and a silicon carbide layer arranged as an adhesion promoter between the transparent carrier structure and the electrically conductive transparent layer, the electrically conductive transparent layer forms the anode.

* * * * *